United States Patent [19]
Mansfield et al.

[11] Patent Number: 5,965,306
[45] Date of Patent: Oct. 12, 1999

[54] METHOD OF DETERMINING THE PRINTABILITY OF PHOTOMASK DEFECTS

[75] Inventors: Scott Marshall Mansfield, Hopewell Junction; Richard Alan Ferguson, Pleasant Valley; Alfred Kwok-Kit Wong, Beacon, all of N.Y.

[73] Assignee: International Business Machines Corporation, Armonk, N.Y.

[21] Appl. No.: 08/950,620

[22] Filed: Oct. 15, 1997

[51] Int. Cl.$^6$ .................................................. G03F 9/00
[52] U.S. Cl. .................................. 430/22; 430/5
[58] Field of Search ............................... 430/5, 22, 322; 356/390, 394

[56] References Cited

U.S. PATENT DOCUMENTS

| 5,721,074 | 2/1998 | Bae ................................................ 430/5 |
| 5,795,685 | 8/1998 | Liebmann et al. .......................... 430/5 |
| 5,795,688 | 8/1998 | Burdorf et al. ............................ 430/30 |

OTHER PUBLICATIONS

J. N. Wiley, et al, "Device Yield and Reliability by Specification of Mask Defects" Solid State Technology, Jul. 1993, pp. 65–77.

P-Y Yan, et al, "Mask Defect Printability and Wafer Process Critical Dimenion Control at 0.25 μm Design Rules", Dec. 1995.

*Primary Examiner*—S. Rosasco
*Attorney, Agent, or Firm*—H. Daniel Schnurmann

[57] ABSTRACT

A method for determining if an undesirable feature on a photomask will adversely affect the performance of the semiconductor integrated circuit device that the mask is being used to create. The method includes inspecting the photomask for undesirable features and analyzing the designed features close to the defects. This analysis is performed on lithographic images that represent the image that is transferred onto the semiconductor wafer by the lithography process. This analysis takes into account the effect of variations that are present in the lithography process. Through knowledge of the effects of variations in mask critical dimension of a feature on the lithographic image of that feature, the analysis results in the assignment of an equivalent critical dimension error to the defect. This equivalent critical dimension error is then compared to the mask critical dimension error specification to determine whether or not the defect will adversely affect the device.

52 Claims, 11 Drawing Sheets

ISOLATED 0.25 MICRON LINE

CONTACT HOLE

CONTACT HOLE
WITH SERIFS

LINE END

LINE END WITH
HAMMERHEAD

CHROME

LINE

LINE WITH
SCATTERING BARS

CLEAR

TRENCH

TRENCH WITH
ANTISCATTERING BARS

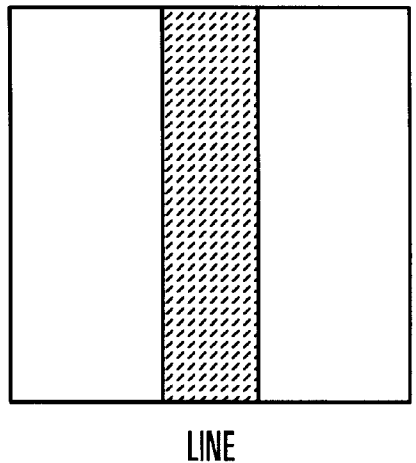
FIG. 7A PRIOR ART
LINE
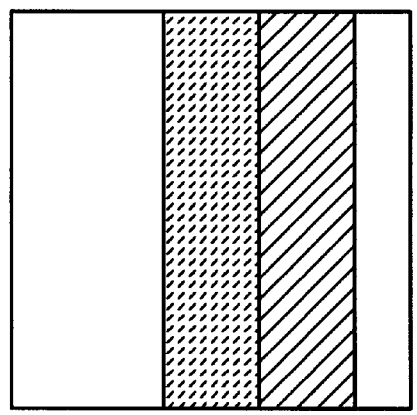
FIG. 7B PRIOR ART
PHASE SHIFTED LINE
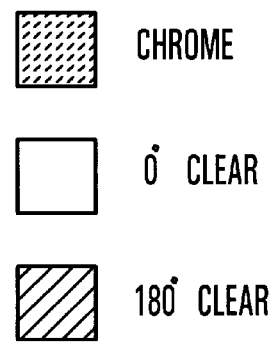
CHROME
0° CLEAR
180° CLEAR

FIG. 8A PRIOR ART
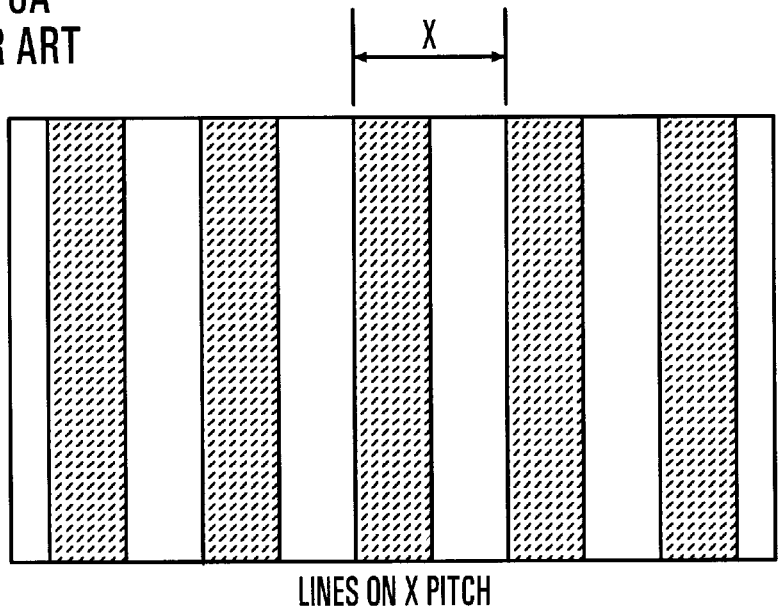
LINES ON X PITCH
CHROME
CLEAR
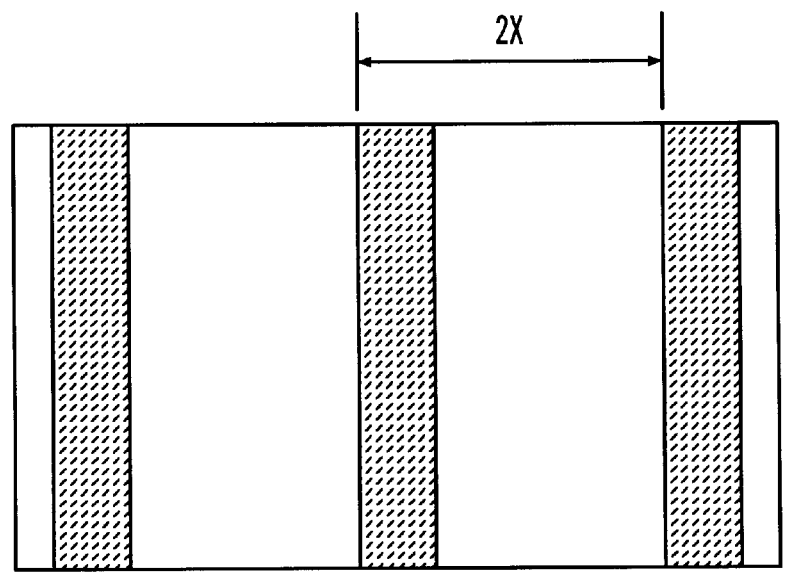
LINES ON 2X PITCH
FIG. 8B PRIOR ART

METHOD OF DETERMINING THE PRINTABILITY OF PHOTOMASK DEFECTS

FIELD OF THE INVENTION

This invention relates, generally, to a photomask inspection process, and more particularly, to a method of determining the effect of photomask defects on the performance of a semiconductor device.

BACKGROUND OF THE INVENTION

In a typical mask making process, all defects that are found on the photomask during the inspection process must be repaired. Most criteria classify defects based on size. Accordingly, inspection tools are tuned to only finding defects that are larger than a specified minimum defect size. It is known in the art that not all defects cause problems during the lithography process. A defect on a photomask is deemed harmful only if the image of the defect is transferred to the wafer during the lithographic printing process. If the defect is not imaged onto the wafer, then the mask maker may not be required to repair the defect altogether, thereby saving time and money. Moreover, if the defect is imaged onto the wafer in a way that it does not adversely affect the performance of the wafer, then this defect is preferably left untouched.

The difficulty in classifying defects as described is that the mask maker is not typically provided with a good methodology for determining what defects will adversely affect the wafer. Defects that are close to a critical feature may have an impact on the feature depending on several factors that include: feature type, proximity of the defect to the feature and the size, shape, phase and transmission of the defect. These effects are further complicated when enhancement techniques, such as phase-shifting masks and optical proximity correction, are utilized. Since defects are traditionally classified by type (e.g., a hole in the chrome) as well as by their size (relative to the critical feature size on the mask), current defect specifications are becoming increasingly difficult to be met, as the size of the critical features on the mask continues to shrink to below 1.0 $\mu$m. This difficulty will likely drive the need for new and more expensive inspection and repair tools, and will lower the achievable yields on advanced photomasks. The end result of the upgrade in tooling translates into an increased cost per mask.

Since photomask inspection tools typically use an optical system that is significantly different than the lithography exposure system, the inspection tool cannot in general predict the effect of the defect on the image transferred to the wafer. It is believed, however, that the inspection systems can find most defects that negatively impact the wafer performance along with those that do not. Since repairs are expensive, certain categories of defects cannot be repaired and some repairs may end up making the defect worse, it is desirable to concentrate on those defects that ultimately will cause problems on the wafer.

To understand the methodology of the invention, one must first have a basic understanding of the "process window" for lithographically printing a feature. The process window for a given feature is the amount of variation in the process that can be tolerated while still maintaining critical aspects of that feature within accepted tolerances from their desired values. In lithography, the process window is normally stated by the amount of focus and exposure dose variation that can be tolerated while maintaining feature sizes and critical dimensions (CD) within a given tolerance of their nominal values.

Process windows are typically found by either taking CD measurements on wafers that have been exposed at various focus and exposure conditions, a focus-exposure matrix (FEM), or by computing the CD from through-focus intensity profiles. In the latter case, the exposure dose can effectively be varied by changing the intensity value at which the CD is measured. These intensity profiles are typically generated either by simulation or by recording through an aerial image measurement system (AIMS) that emulates the lithography exposure conditions. The AIMS typically consists of a microscope that has a numerical aperture and illumination conditions that emulate the lithography exposure conditions. This system records the aerial image, or the image of the photomask that is projected onto the photoresist by the lithography exposure tool.

FIG. 1a shows the intensity profile through a bright-field isolated line taken at five focus conditions. From this figure, the dimension of the line that prints in the photoresist can be found by drawing a line across the intensity plots at a constant intensity level, (e.g., line 101). Assuming that the photoresist has a threshold response to the light intensity impinging upon it, the printed dimension can be determined by finding the intersections of the intensity curve for a given focus and the constant intensity line, such as points 102 and 103 for the 0.0 $\mu$m defocus line, and points 104 and 105 for the 0.5 $\mu$m defocus line.

In all the regions where the intensity level exceeds the threshold level, for a positive tone photoresist, the photoresist undergoes a photochemical reaction that allows it to be removed with a developer solution. All the regions having intensities below the threshold level are resistant to the developer solution and remain intact on the wafer after the development process. In FIG. 1a, the intensity of the light reaching the photoresist has been normalized by the intensity of light in a large clear area, I0. In a threshold resist model, if the dose-to-clear (DTC) is defined as the dose required to just develop away a large clear area, then the dose needed to print at a given threshold level is determined by the inverse of the normalized intensity at that threshold multiplied by the DTC. For example, if the exposure dose is given by 4.0*DTC, the normalized intensity at the threshold level is 1/4.0=0.25. It is understood that not all photoresists have a threshold response to the incident light intensity. Nonetheless, most photoresists can be analyzed using a similar method.

Practitioners in the art will fully realize that for an exposure dose set at 4.0*DTC, the threshold for exposure will be 0.25, which approximates the threshold drawn by line 101. For this exposure dose, the size of the line printed in photoresist will be determined by the separation between points 103 and 102, or about 0.25 $\mu$m, for the 0.0 $\mu$m defocus condition, and by the separation between points 105 and 104, or about 0.17 $\mu$m for the 0.5 $\mu$m defocus condition. Likewise, for a lower exposure dose set at 2.0*DTC, the exposure threshold will be given by an intensity value of 0.5, which in FIG. 1a corresponds to line 106. Therein, the printed dimension remains basically constant for defocus positions between 0.0 and 0.5 $\mu$m. This dimension, approximately 0.35 $\mu$m, is defined by the separation between points 108 and 107.

From the CD measurements, one can find functional dependencies of feature size versus focus and exposure dose. FIG. 1b depicts a plot of the line width versus focus at various doses for the isolated line. On this plot, point 111 corresponds to the line width for an exposure dose of 4.0*DTC and a defocus of 0.0 $\mu$m, which is equivalent to the separation between points 103 and 102 (FIG. 1a). Likewise, point 112 is the line width for the same dose and defocus of 0.5 μm, which is the separation between points 105 and 104 (FIG. 1a). Points 113 and 114 are the line widths found for a dose of 2.0*DTC at defocus values of 0.0 and 0.5 μm, respectively.

The line width versus focus and dose functions can now be used to determine the amount of focus and dose variation that can be tolerated by the lithography system while maintaining the feature size within the desired tolerance from its nominal size. This is one representation of the process window of the feature. An illustration applicable to an isolated line is depicted in FIG. 1c. Shown therein is the focus value plotted on the vertical axis against the logarithm of the dose on the horizontal axis. Curve 121 represents focus and dose conditions wherein the dimension of the line printed in the photoresist equals the target dimension, 0.25 μm, to which the tolerance is added, e.g., 10% of 0.25 μm or 0.025 μm. In this case, curve 121 represents the conditions where the line prints at 0.25+0.025=0.275 μm. Curve 122 represents the conditions where the line prints at the target minus the tolerance, i.e., 0.25−0.025=0.225 μm. The region between the curves represents the focus and dose conditions where the line is printed in photoresist within the desired tolerance of its nominal size. Likewise, the common process window of two features can be determined by how much focus and dose variation can be tolerated while still maintaining both features within an acceptable tolerance from their nominal sizes.

The process window for a given tolerance can also be stated as the amount of focus variation that can be tolerated, commonly referred to as the depth-of-focus (DOF), and which is a function of the amount of exposure dose variation, or exposure latitude (EL). FIG. 1d shows a representation of the process window for the isolated line. This curve is often found by determining the largest rectangles that are contained within the positive and negative tolerance lines shown in FIG. 1c. In this case, the horizontal dimension of the rectangle corresponds to a given dose variation. The vertical dimension represents the amount of focus variation that can be tolerated when the given amount of dose variation is present while maintaining the line width within tolerance. In FIG. 1c, rectangle 123 represents a 25% dose variation, and its vertical dimension corresponds to a focus variation of 0.6 μm. In FIG. 1d, point 124 corresponds to a 0.6 μm DOF at 25% EL. Since it is more convenient to specify a process window in terms of a single number, the process window will often be specified as either the depth of focus at 10% exposure latitude or the amount of area under the DOF versus the EL curve, which is commonly known as the total window. Other values can also be used as a measure of the process window.

FIG. 2 outlines a conventional process used by a device manufacturer to set a mask defect specification followed by the mask manufacturer using that specification during the inspection/repair process.

In the conventional process that defines a defect specification, the device manufacturer determines the wafer nominal CD and CD tolerance in the manner to be described hereinafter with reference to FIG. 4. However, the mask CD tolerance is normally set as only some fraction of the wafer CD tolerance (204). By way of example, the mask CD tolerance is often set at one-third times the exposure tool magnification of the wafer CD tolerance, or ⅓ times the wafer CD tolerance for a 4× exposure tool. Accordingly, if the wafer CD tolerance is 30 nm, the mask CD tolerance will be set at 40 nm for a 4× mask. This fractional method is based on apportioning a certain fraction of the total error budget to different parts of the process. Herein, the mask error is allocated one-third of the total error budget, variations in the lithography process are allocated another one-third, and all remaining process variations are apportioned the final third. This method is generally valid for printing features having a k1 factor larger than about 0.5, wherein:

k1= feature size * stepper numerical aperture/wavelength of the exposure illumination.

The method of allocating an error budget becomes invalid for imaging where k1 drops below 0.5 due to the amplification of mask errors by the lithographic process.

Referring again to FIG. 2, mask defects are, typically, only specified by their size, and this size is taken as a fraction of the nominal mask critical dimension (206). For instance, it is normal to consider as defects any undesired structures on the mask having a dimension greater than 10% of the nominal mask dimension. For a mask with nominally 1.2 μm features, all undesired features that are larger than 120 nm are considered defects. Since the wafer CD tolerance specification for these types of features is usually about 10% of the nominal wafer dimension, the wafer CD tolerance for these features will be approximately (1.20 μm/4) * 0.1= 30nm. Then, the mask CD specification is typically set at ⅓×30 =40nm. This indicates that the defect criterion does not correlate well to the mask CD specification. By allowing the defect specification to be larger than the CD specification, the device manufacturer has traditionally supported the concept that defects do not impact the wafer image as much as a CD variation. The conventional method of quantifying this concept is, however, somewhat arbitrary.

The standard mask inspection/repair process entails incorporating the defect size criterion of the device manufacturer into the inspection tool (208). The tool then locates all undesired features that are larger than that predetermined defect size. Each defect is then reviewed and classified. If a defect is considered non-repairable, then a judgment call (211) is made to establish whether or not the defect will print on the wafer. Advanced mask makers may utilize the AIMS tool to facilitate this process, but it is standard practice with an AIMS review to base this decision strictly on a comparison of the peak intensity values for defective and non-defective features. The behavior of the defect at various dose and focus conditions is not normally considered. If the defect is not repairable and is believed to negatively impact a critical feature on the wafer, the mask is routinely scrapped (212). After review, all repairable defects are typically repaired (210) and the mask finished and shipped (214).

OBJECTS OF THE INVENTION

It is an object of the present invention to provide a method of determining if a defect that is detected by a photomask inspection tool will adversely affect the wafer.

It is another object of the present invention to provide a method of relating defect specifications directly to device performance and wafer yields.

It is still another object of the invention to provide a method for permitting a mask maker to evaluate the effect of a defect on the printed wafer with little knowledge of the wafer lithography process, through the use of measurements structures placed in a section of the semiconductor chip that do not influence the functionality of the chip. These sections are commonly referred to as kerf or scribe.

It is a further object of the invention to increase mask yields, improve turn-around-time, and reduce mask costs.

SUMMARY OF THE INVENTION

In accordance with one aspect of the present invention, there is provided a method of determining if undesirable features or defects that are located on a photomask will adversely affect the performance of the semiconductor device being created by the photomask. The method is based on analyzing images of features close to the defect, wherein images are found such that they approximate the image of the photomask that will be printed in the photoresist on the wafer. Multiple images are taken that span variations that are present in the lithography process. By incorporating the knowledge of how a wafer image varies with variations in size of the features on the photomask, this analysis leads to assigning an equivalent feature size variation or an equivalent critical dimension error to the defective feature.

Another aspect of the invention is to provide a method for quantifying the variation of a wafer image for a set variation in a photomask feature. The method provides a method to set mask critical dimension tolerance specifications and assign equivalent critical dimension errors to the defects. The ultimate result of the method is the ability to determine if a defect negatively impacts the semiconductor device performance beyond the tolerable feature size variation. If it does, then this defect must be repaired or the photomask rebuilt.

In a further aspect of the invention, a method is provided for dispositioning photomasks with optical proximity correction (OPC) or phase shifting features. Since the design of the photomask containing the OPC or phase shifting features does not always look like the pattern that is desired in photoresist (or the design created by the semiconductor device designer), these types of photomasks create new inspection challenges. In this case, the pattern printed in the photoresist may be much less sensitive than that of a standard binary photomask to the shape or size of certain features on the photomask. Likewise, the photoresist pattern may be much more sensitive to the shape and size of other features on the photomask. The invention provides a method of determining which feature variations detract from the semiconductor device performance and relates these variations to the CD variation of a critical feature.

In accordance with yet another aspect of the invention, a method is provided for determining if variations in the critical dimension of features on the photomask will adversely affect the performance of the semiconductor device. All features on a photomask have other features that are close to them, these being the nearest neighboring features. Depending on the spacing between a feature and its nearest neighboring features, the image of the feature that is printed in the photoresist may be more or less sensitive to variations in size of the feature on the photomask. Typically, as this spacing decreases (and the feature becomes more nested), the image of the feature becomes more sensitive to variations in size. It is evident that different features on the photomask may require different CD tolerances based on the locations of features around them. The invention provides a method for imposing different tolerances by relating the photomask variation to its corresponding variation on the wafer.

BRIEF DESCRIPTION OF THE DRAWINGS

While the specification concludes with claims particularly pointing out and distinctly claiming what is regarded as the present invention, details of several preferred embodiments of the invention may be more readily ascertained from the technical description when read in conjunction with the accompanying wherein:

FIG. 7a shows a standard line pattern on a photomask;

FIG. 7b is a phase-shifted line pattern on a photomask;

FIG. 8a is a standard line/space pattern with a pitch given by a dimension X on a photomask; and FIG. 8b is a standard line/space pattern with a pitch given by a dimension 20 on a photomask.

DETAILED DESCRIPTION OF THE INVENTION

Figure 3:
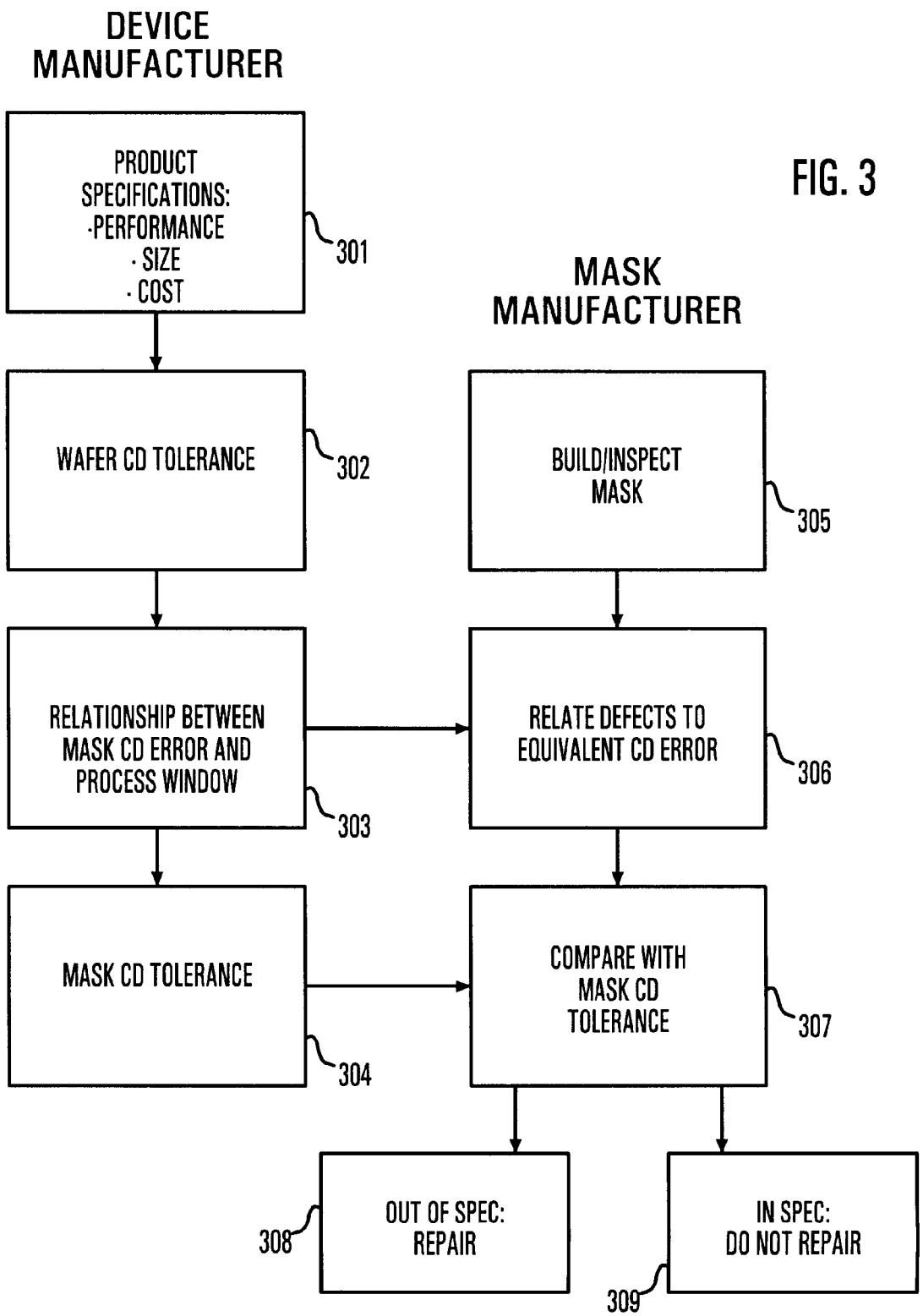
FIG. 3 is a flow chart showing an overview of the steps required to determine if a defect that was detected by a photomask inspection tool will adversely affect the wafer, in accordance with the present invention.

The method that is described herein, and which is summarized in FIG. 3, is used to determine whether a mask should be scrapped based on a defect criterion. In its preferred embodiment, this method is not intended to replace the CD tolerance or other specifications to which a mask may typically be disposed of. Instead, it is assumed to be used to replace the defect criterion, and in conjunction with these, other specifications. The method of the invention provides a method of determining if a reticle defect has a significant effect on the wafer image.

Initially the semiconductor device manufacturer must set the mask critical dimension tolerance specification. This is accomplished by analyzing the process window for printing features with varying sizes on the photomask and finding the functional relationship between mask CD error and process window (303). This relationship is then used to set the mask CD tolerance based on the necessary process window to achieve the product specifications (304).

The photomask manufacturer can then use this information to disposition defects. The method is based on comparing process windows of the features close to the defect to those of non-defective features. The common process window of the "defective" and "non-defective" features are then compared to the common process windows of features that have known CD variations. In this manner, the defect can be correlated to a mask CD variation and an error value can be assigned to the defect (306). This effective CD error can then be compared to the desired mask CD tolerance (307). If the effective CD variation caused by the defect is less than the mask CD tolerance, then the defect can be considered a "non-printing"defect and it will not need to be repaired (309).

Figure 4:
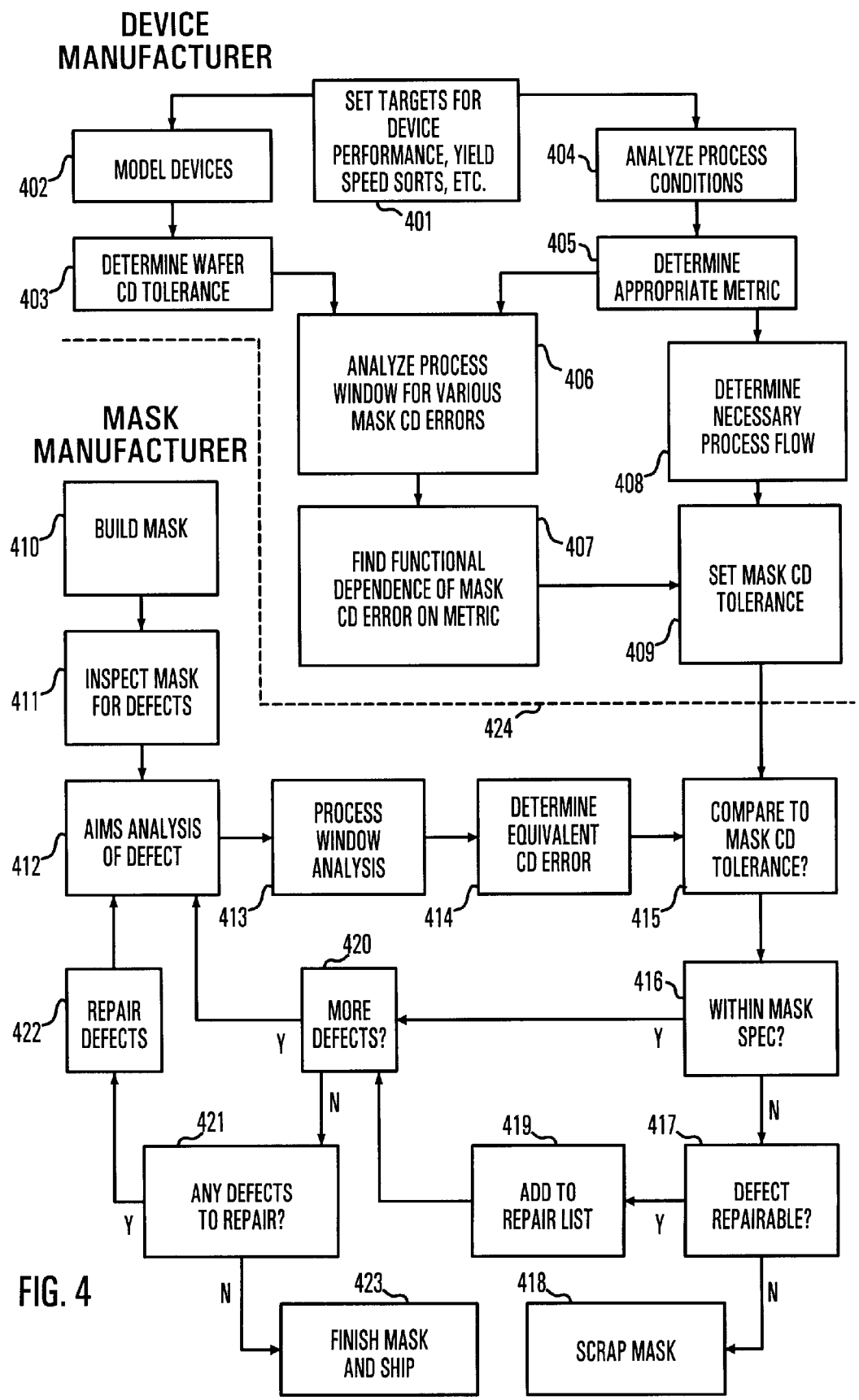
FIG. 4 is a detailed flow chart illustrating how the method can be apportioned between a device manufacture and a mask manufacturer, in accordance with the present invention.

Referring now to FIG. 4, a flow chart is shown depicting an overview of the steps that are required to determine whether a defect that was detected by a photomask inspection tool could adversely affect the wafer.

As outlined in FIG. 4, the method of the invention can be broken into two major areas of responsibility that are shown separated by the dotted line (424). The first area is the responsibility of the semiconductor device manufacturer and entails determining the appropriate wafer and mask CD tolerances for each critical feature type. The first step in the process entails a high level analysis of the desired targets for the product being manufactured (401). These targets include such considerations as the desired device performance, yields and speed distributions. Once the targets are set, the devices are modelled (402) and the wafer nominal CD value and CD tolerances set (403) to ensure that the desired performance can be achieved. At the same time, the manufacturing process should be analyzed (404) to establish the critical processes and determine which parameters of the lithographic processes are most critical. These parameters will typically be specified as some combination of focus and dose control. Either a single metric, such as the area under the depth-of-focus versus exposure latitude curve, or several matrices, such as the depth-of-focus at 10% exposure latitude and the total exposure latitude, can then be chosen to measure the quality of the lithographic process (405). In an extreme case, the depth of focus at all exposure latitudes can be considered. Alternatively, a metric based on a statistical distribution of feature sizes could be used. For now, it will assumed that a single metric can be computed, but it is understood that many different metrics can be advantageously chosen.

Figure 5A:
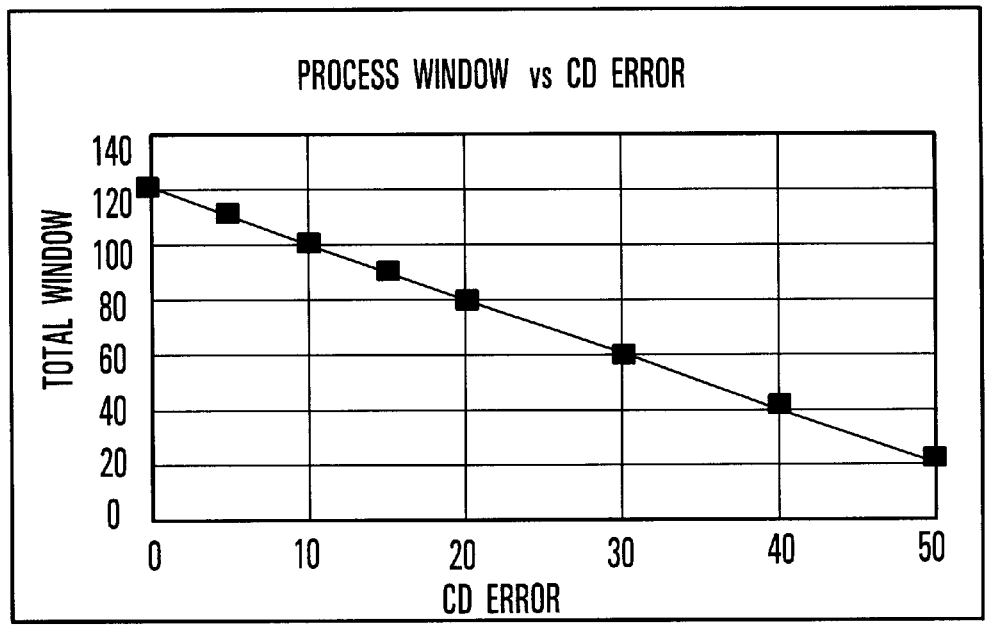
FIG. 5a is a plot of the process window versus CD error.

With the wafer CD tolerance and the appropriate lithographic metric defined, the lithography process can now be analyzed to determine the effect of mask variations (406). This analysis can be performed in several ways that include: simulation, aerial image measurements, and wafer exposures. The analysis involves determining how much the image that is printed on a wafer will change when the mask dimension varies and should be executed using lithographic conditions that are as close as possible to those that will be used in the manufacturing process. By way of example, the exposure tools numerical aperture and illumination type should be matched and, for simulation, the resist development effect should be accounted for. Herein, process conditions are determined that result in the feature of interest being printed on the wafer at a dimension that resides within the wafer CD tolerance from the desired nominal value. The value of the metric is determined for the common process window of features that are at the nominal mask dimension and those that are within a set error of this dimension. As the mask error becomes larger, the metric will generally decrease. This is to be expected since the process conditions that will produce valid wafer CDs (at a size that is within the given specification from the nominal size) for all features on the mask will be more limited as a larger range of mask dimensions are included. It is understood, however, that some metrics may actually increase as the mask CD error increases. An example of this would be the standard deviation of a statistical feature size distribution. The object of the analysis is to determine a functional relationship between the metric and the mask CD error. One of the simplest functional relationships would be simply a line fit of values of the metric plotted versus the mask error. FIG. 5a shows an example of the total window plotted versus CD error, along with a quadratic fit to the data. This curve is generally valid for only one set of conditions (imaging parameters, photoresist, feature type and size), but other conditions will display a similar behavior.

Figure 5B:
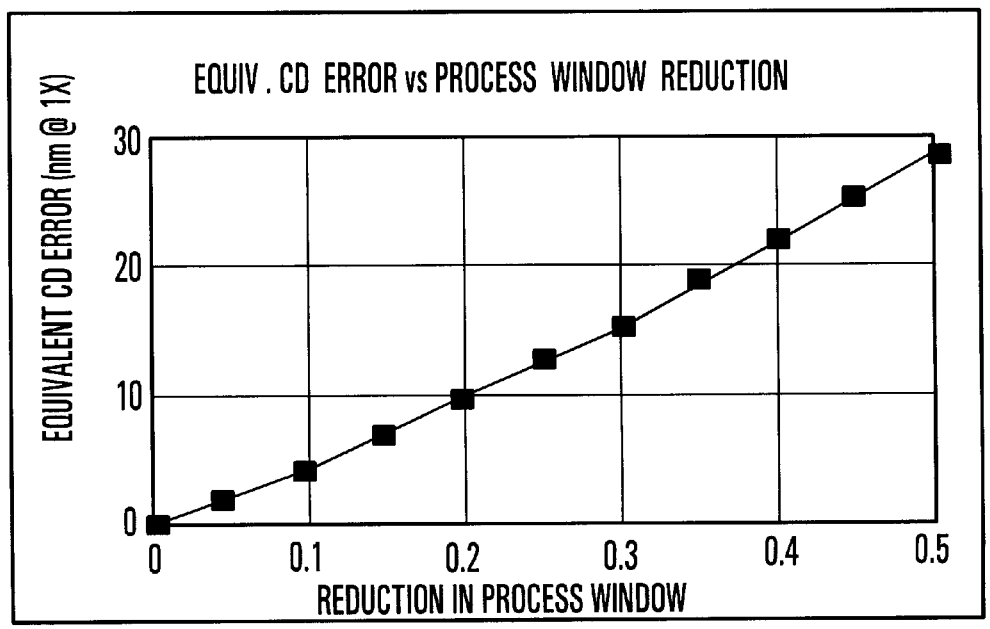
FIG. 5b is a plot of an equivalent CD error versus process window reduction.

The metric versus mask error function can be inverted to give the functional dependence of the mask CD on the metric (407). The execution of this step will generally depend on the functional form found for the metric versus CD error. FIG. 5b shows an example of the functional dependency of the mask CD on the total window. This dependency was found by solving the quadratic equation for the case shown in FIG. 5a.

After the process has been analyzed to ascertain the appropriate metric (404–405) and the functional dependency of the mask CD error versus the metric has been determined (406–407), a mask CD tolerance can be set. This step involves taking the information from the process analysis and determining the amount of variation that is likely to be present in the lithography process. This analysis can be based on such considerations as the amount of variation in certain thin film thicknesses on the wafer, how flat the wafer is, the accuracy of the exposure tool focusing system and aberrations in the lenses. Since these parameters were already used to determine the appropriate metric, it is straightforward to quantify them and set an appropriate value for the metric (408). This value is then incorporated into the function found for the mask CD error versus the metric to assign the mask CD tolerance (409).

Steps 401–409 define the mask CD tolerance to be the amount of mask CD variation that can be tolerated in the lithography process, accounting for all the variations that are present in that process, while still producing features on the wafer that remain within the wafer CD specification from the nominal wafer dimension. Traditionally, as it is also the case in this method, it is generally considered the responsibility of the device manufacturer to determine the mask CD tolerance. As will be shown hereinafter, the benefit of this approach is that it ties the mask CD specification directly to the wafer CD specification, while still accounting for the lithography process and variations of that process. A second benefit of this approach is that it directly connects the mask defect criterion to the wafer CD specification. This is possible due to the computation of the mask CD error versus lithographic metric function which can be directly given to the mask manufacturer. As will be shown hereinafter, this can also be inferred from test structures that can be designed into the reticle.

The responsibility of the mask manufacturer is summarized in steps 410–423 (FIG. 4). The reticle patterning (410) and inspection (411) are completed as normal. However, the inspection tool may be set to a more sensitive setting than the normal since, ultimately, not all the defects that are detected will be repaired. Once the mask has been inspected, all the defects are reviewed using the aerial image measurement system (AIMS) that is set up to emulate the exposure conditions. Alternatively, the mask could be exposed on an exposure tool and the wafers measured, but this method would be expensive and time consuming. AIMS measurements are taken through a range of focus values, so that the process window that prints the features at their desired size could be found. Along with the AIMS measurements of the defective feature, further AIMS measurements are also taken of nominally sized features. These features could be measurement sites in the kerf or selected non-defective features in the active region of the chip.

A common process window of the defective and non-defective features is then found (413), and a value for the lithographic metric is determined. This value can be incorporated into the mask CD error versus metric function to find an equivalent mask CD error for the defect (414). Accordingly, the effect of the defect can be quantified and related to the CD variation in a manner that accounts for its behavior in the presence of variations that exist in the lithography process. It now becomes straightforward to determine if the defect will cause problems on the wafer and, therefore, whether it is necessary to repair it. If the equivalent CD error lies within the mask CD specification, it is not repaired (415–416). If it falls outside the mask CD specification and it is a repairable defect, it is then flagged for future repair (415–416 and 419). If it falls outside the specification,mask is not be repaired, then the mask is scrapped (415–418).

Each defect that is found on the inspection tool is reviewed in a similar manner (412–420). After reviewing all the defects, if some are found to reside outside the specification and are repairable (421), the mask is repaired (422). The repairs can then be reviewed and re-analyzed to ensure that they will not print outside the CD specifications. The process (412–422) is then repeated until the mask is defect free. It can then be sent to be finished and shipped (423).

The inspection/repair method outlined in steps 410–423 provides several substantial benefits over standard conventional inspection/repair methods. These are best understood by comparing them with a standard inspection/repair process.

Figure 1A:
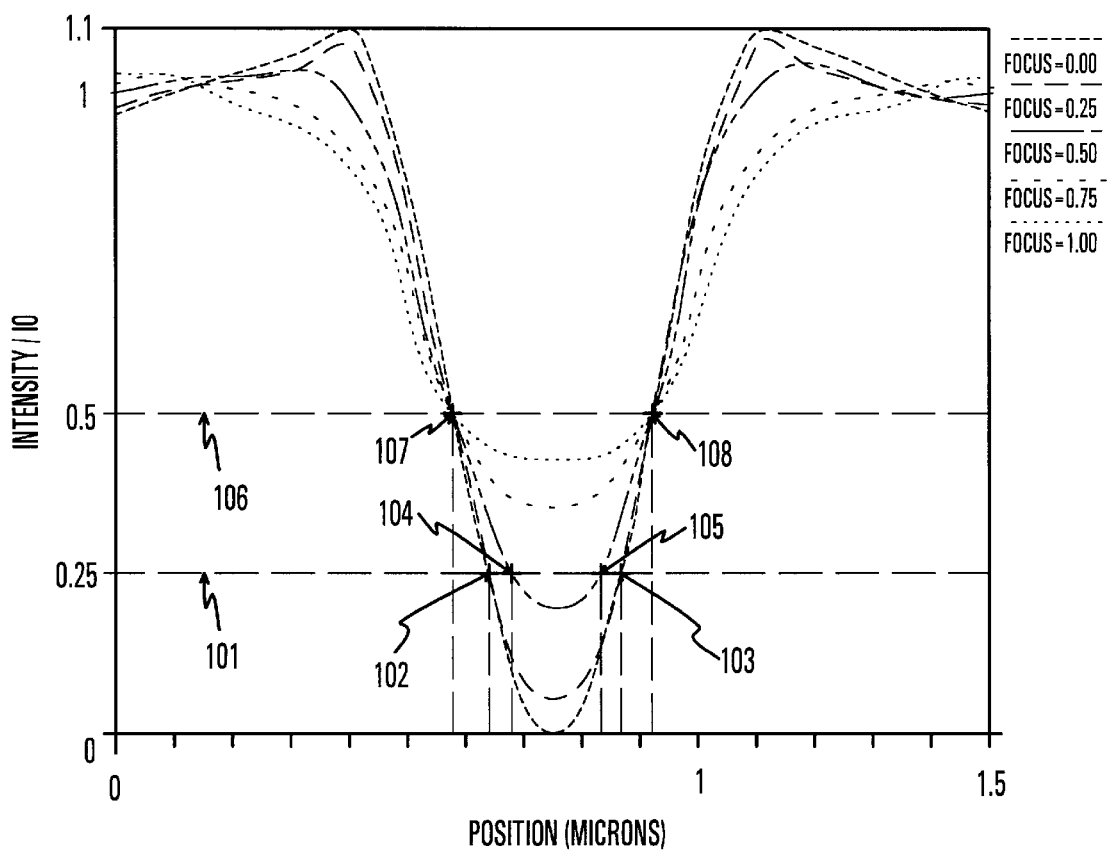
FIG. 1a shows a conventional plot of the intensity profile that would exist at the wafer for a bright field isolated line pattern on a photomask taken under five focus conditions.
Figure 1B:
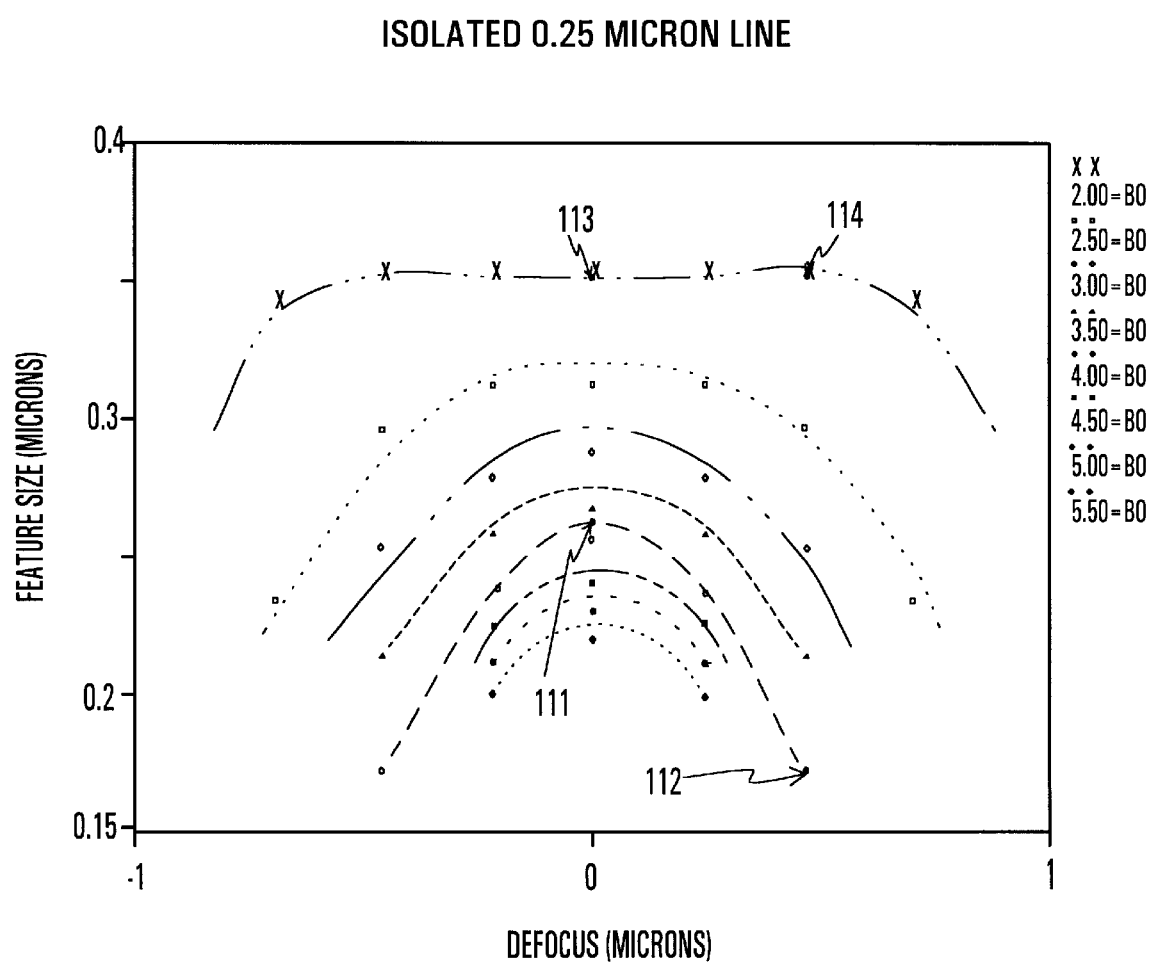
FIG. 1b is a conventional plot of the line width versus focus for various doses applied to the isolated line.
Figure 1C:
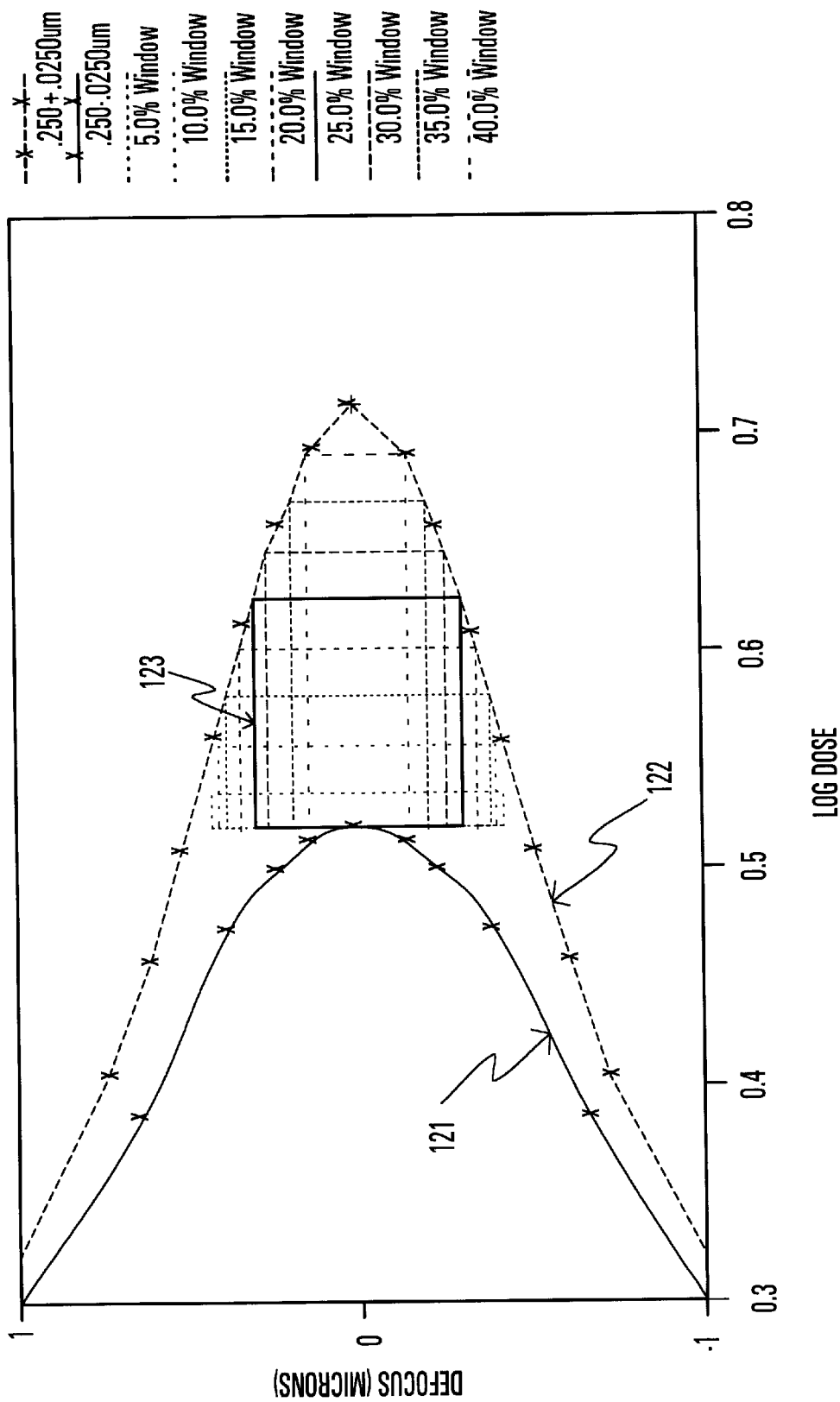
FIG. 1c illustrates a conventional plot showing a feature process window as it applies to the isolated line example of FIG. 1b.
Figure 1D:
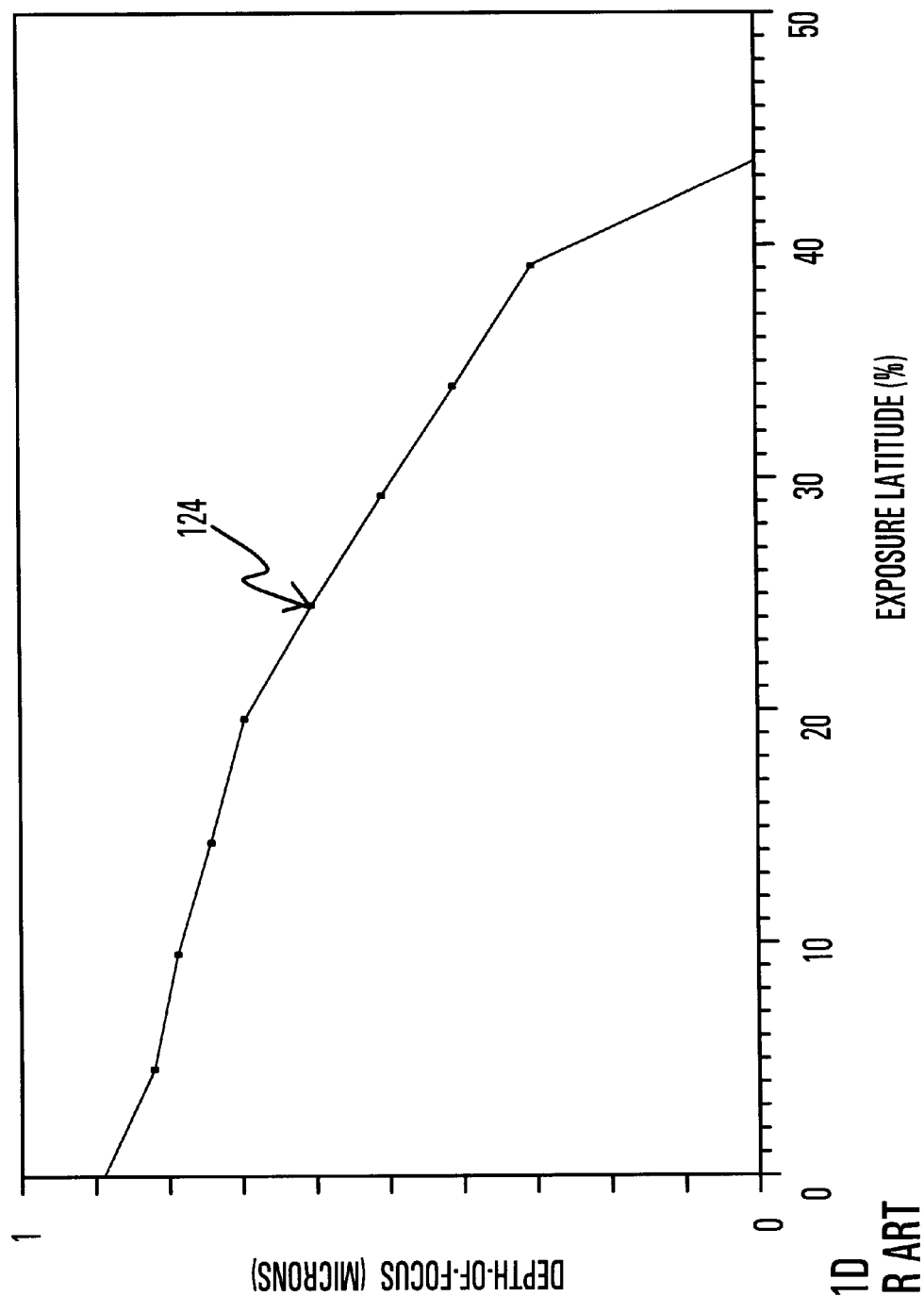
FIG. 1d shows a conventional representation of the process window for the isolated line, in which the depth of the focus is plotted against exposure tolerance.
Figure 2:
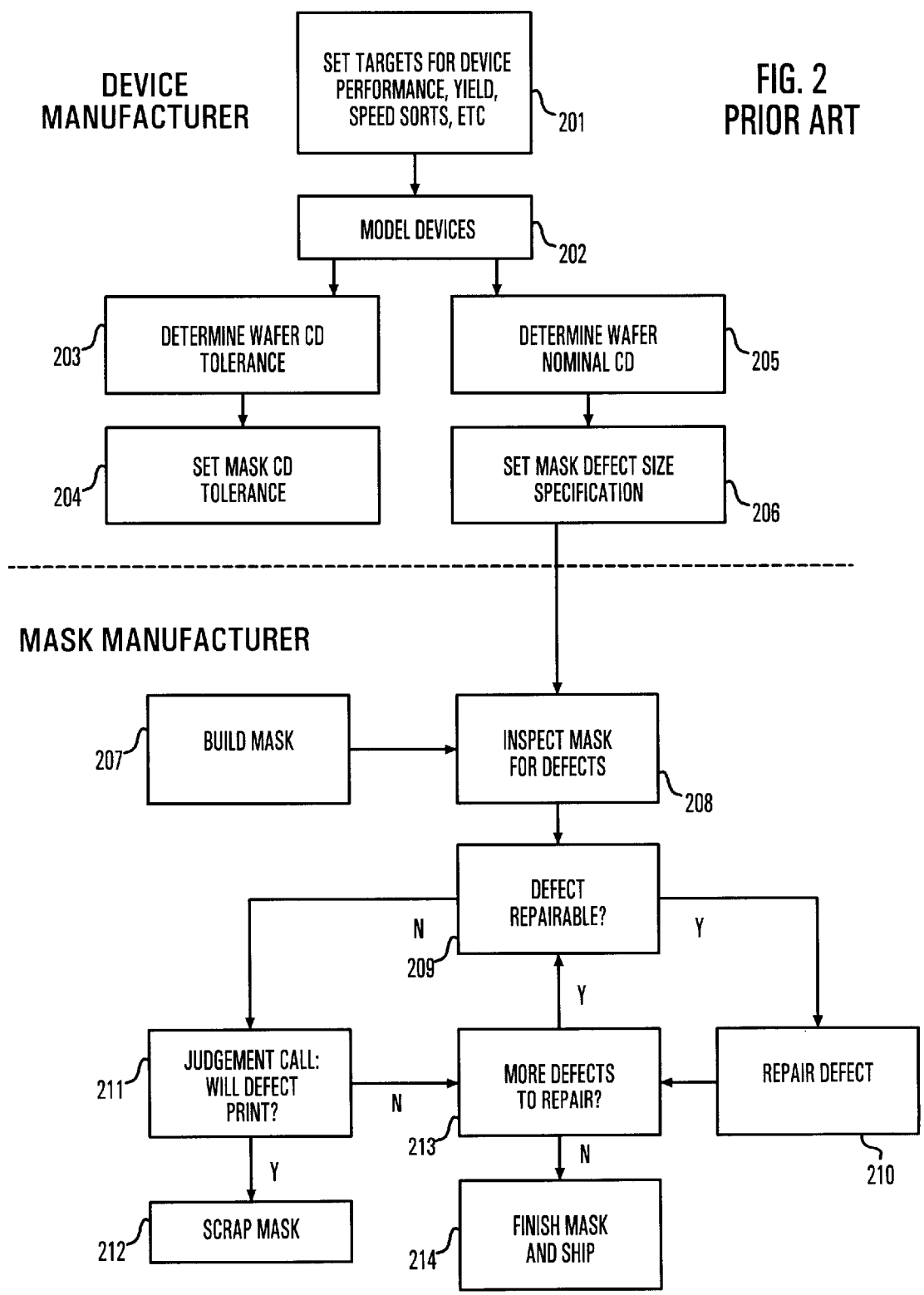
FIG. 2 is a flow-chart that outlines a prior art process used by a device manufacturer to set a mask defect specification and for a mask manufacturer to utilize the specification as it used in a conventional inspection/repair process.

The difference between the inspection/repair process outlined in FIG. 4 and the one shown in FIG. 2, is that the former is essentially a method of determining if a defect on a photomask will impact the wafer performance. The conventional process illustrated in FIG. 2, on the other hand, at best provides certain safeguards that are set based on experience. Because of the nature of the prior art method, many defects that have no effect on the wafer performance are repaired unnecessarily. Since the defect size criterion typically is scaled in accordance to the feature dimensions, this approach becomes more difficult as the size of the features continues to shrink. This difficulty arises for reasons that include: defect sizes becoming smaller than the minimum size that is detectable with visible wavelengths of light; optical proximity correction introducing 'sub-resolution' structures to masks that may look like defects; and phase-shifting masks introducing new materials and complex interactions between closely spaced features. These effects drive a need to change the traditional methodology for determining what defects need to be repaired.

A second embodiment of the invention relates to dispositioning photomasks containing OPC or phase-shifting structures. Since these features are placed on the photomask to improve the resolution of the final resist image, they will generally be referred to as resolution enhancement (RE) features. Examples of optical proximity correction RE features are shown in FIG. 6, along with the standard form of each of these features.

Figure 6A:
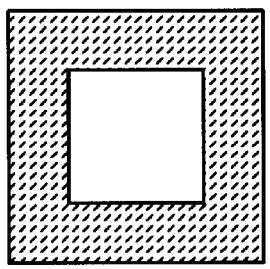
FIG. 6a shows a standard contact hole pattern and a contact hole pattern with serifs on a photomask.
Figure 6A:
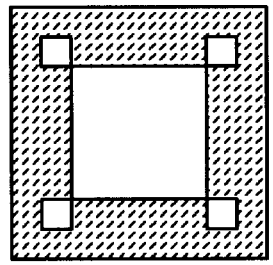
Figure 6B:
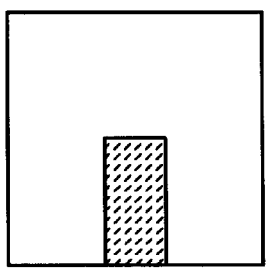
FIG. 6b shows a standard line end pattern and a line end pattern with a hammerhead on a photomask.
Figure 6B:
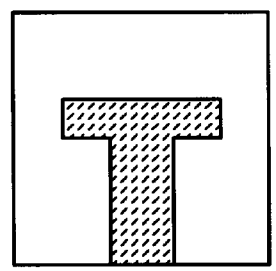
Figure 6B:
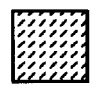
Figure 6C:
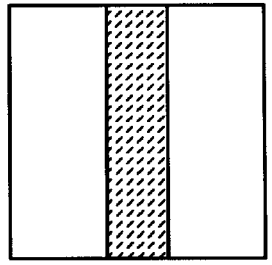
FIG. 6c shows a standard line pattern and a line pattern with scattering bars on a photomask.
Figure 6C:
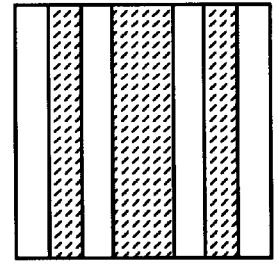
Figure 6C:
Figure 6D:
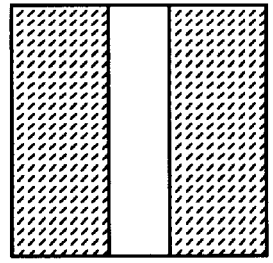
FIG. 6d shows a standard trench pattern and a trench pattern with anti-scattering bars on a photomask.
Figure 6D:
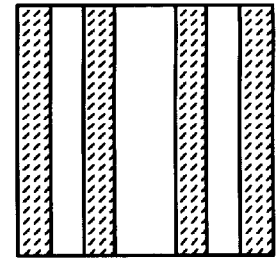

FIG. 6a shows a small contact hole with serifs placed on its four corners, and FIG. 6b illustrates the end of a line with a hammerhead OPC feature. FIG. 6c shows small scattering bars on each side of the main critical line, and FIG. 6d shows small anti-scattering bars on each side of a critical trench.

FIG. 7 depicts a phase shifting RE feature. FIG. 7a is a standard isolated line, and FIG. 7b is an isolated line with a 180 degree phase transition across it.

While the method described in the present embodiment is basically identical to the first embodiment, the motivation is substantially different. In the latter embodiment, the performance of the RE features that are desired to be on the photomask can be evaluated. These structures are not defects and will generally exist in the design data for the photomask. These structures will generally not exist in the design data created by the device designer. Instead, they will typically be added by a post-processing computer program that takes device designs and modifies them. These modifications are done so as to pre-distort the design in a manner that counteracts the distortions that occur to the design as it is transferred from the photomask to the wafer. The purpose of adding these structures, is to ensure that the final pattern that is transferred to the wafer is closer to what the device designer in reality wants than it would have been without the structures.

Since the RE features are not printed on the wafer, but are only instrumental in transferring desired critical features, the mask CD tolerance for these RE features may be substantially different than the tolerance for the critical features. Using the method described previously, however, the influence of these RE features on the wafer performance can be determined. The primary modification of the method is that the photomask does not generally have to be inspected to find these RE features. Their locations can be found in the design data. In this case, this methodology could be used to evaluate the effectiveness of the RE feature and could be used on a sampling basis, similar to a CD meteorology sampling.

It may be desirable, however, to only analyze those RE features that differ significantly from their designed size. These cases may be located through an inspection step. In this case, the inspection tool may be set at a sensitive setting so as to catch all potentially problematic RE features. This method could then be utilized to determine which feature variations would cause problems on the wafer and which ones would not.

This equivalent CD error method can be used to relate variations in RE features to variations in the CD of the critical feature. In the example shown in FIG. 6a, if one of the four serifs placed at the corners of a small contact hole is missing, then the resulting reduction in process window to print the contact in photoresist may be less than the tolerable mask CD error for that contact. In this case, the serif need not be repaired. On the other hand, if a serif is missing and one of the others is smaller than desired, then the equivalent CD error may be intolerable. Likewise, for the phase shifted line in FIG. 7b, if the size of the phase region varies, then the process window to print the critical line may also vary. This method provides a way of determining at what point the phase region size variation becomes intolerable.

A third embodiment of the invention relates to measuring critical dimensions of critical features on a photomask that are transferred to a wafer using a lithography step. As with the second embodiment, this embodiment generally uses the methodology described in the preferred embodiment, but the motivation is again different. In this case, the amount of tolerable variation in any critical feature on a photomask can be related to the amount of tolerable variation in a predetermined reference feature.

Practitioners of the art will fully realize that, generally, a feature of a given size, shape, and distance to its nearest neighboring features, will have a different tolerance to variations in its size than a similar feature having the same size and shape but with a different distance to its nearest neighboring features. An example is illustrated in FIG. 8 showing repetitive line/space patterns, wherein the distance to the nearest neighbors of each line is the same. This distance also defines the size of the space. The period of repetition (line size plus space size) specifies the pitch. Lines having a preset nominal size and allowing for a given amount of size variation on the mask, the amount of reduction in the process window to print the lines within their specification on the wafer will vary depending on the pitch of the lines. Lines with the smallest pitch (the most nested) will generally be less tolerant to variations in size than lines on a larger pitch. In this case, the lines having the larger pitch may not need to have as tight a mask CD specification as the lines with the smaller pitch.

Although in the previous example only the pitch dependency of mask CD specifications for line/space patterns is described, other similar type dependencies are known to exist. These include, but are not limited to, the difference between different feature types and the effect of different nearest neighbor sizes. This embodiment allows the variation in CD of a wide range of features to all be related to a single mask CD error tolerance. This method ensures that all features on the photomask will be printed in photoresist within their tolerable wafer CD criterion for the same set of process conditions.

While the invention has been described with reference to several preferred embodiments thereof, those skilled in the art will readily understand that the method of the invention is not limited to the precise details and conditions disclosed and that various changes and modifications and equivalent steps may be made therein without departing from the spirit of the invention which is defined by the claims that follow.

What is claimed is:

1. A method for determining if defects on a photomask will adversely affect the performance of a semiconductor device on a wafer, said device being created by said photomask through a lithographic process, said method comprising the steps of:
    a) inspecting said photomask to find said defects;
    b) analyzing process conditions that cause designed features close to said defects to be printed on said wafer with dimensions which fall within the wafer critical dimension tolerance that is applicable to said designed features;
    c) assigning an equivalent critical dimension error to said defects; and
    d) comparing said equivalent critical dimension error to a mask critical dimension error tolerance for determining whether said defects will adversely affect the performance of said semiconductor device.

2. The method as recited in claim 1, wherein when said equivalent critical dimension error is less than said mask critical dimension error tolerance, said defect will not adversely affect the performance of said semiconductor device, and when said equivalent critical dimension error is larger than said mask critical dimension error tolerance, said defect will potentially affect the performance of said semiconductor device and will be required to be repaired.

3. The method as recited in claim 1, wherein said analysis is performed by using measurements taken on lithographic images that represent the image that is transferred onto said wafer by said lithographic process.

4. The method as recited in claim 3, wherein said analysis of said process conditions further comprises examining an amount of tolerable variation existing in said lithographic process while generating features on said wafer that are contained within a wafer critical dimension tolerance, said variation comprising focus and dose variations.

5. The method as recited in claim 4, wherein said wafer critical dimension tolerance derives a relationship between variations in the size of a feature on said photomask and said amount of tolerable variation of said lithographic process, said variations in the size of the feature being referred to as mask critical dimension errors.

6. The method as recited in claim 5, wherein said relationship further derives said mask critical dimension tolerance for all critical features within said photomask.

7. The method as recited in claim 5, wherein said size is a one-dimensional cross-sectional size.

8. The method as recited in claim 5, wherein said size is a two-dimensional area.

9. The method as recited in claim 5, wherein said wafer critical dimension tolerance is derived by analyzing product specifications that comprise performance, size and cost.

10. The method as recited in claim 5, wherein said relationship assigns said equivalent critical dimension error.

11. The method as recited in claim 5, further comprising analyzing process conditions that are required for generating lithographic features, said analysis comprising all process steps preceding said lithographic process.

12. The method as recited in claim 5, wherein said relationship is determined by simulating said lithographic process.

13. The method as recited in claim 12, wherein the effect of process steps following said lithographic process is included in said simulation.

14. The method as recited in claim 5, wherein said relationship is determined by printing features of various dimensions on said wafer with said lithographic process, and then measuring said features on said wafer, said lithographic process including a plurality of focus and dose conditions such that effects of process variations can be analyzed.

15. The method as recited in claim 5, wherein said relationship is determined by measuring features of various dimensions with an imaging system that emulates a lithographic exposure tool, said measurements including a plurality of focus and dose conditions such that effects of process variations can be analyzed.

16. The method as recited in claim 15, wherein the effect of process steps following said lithographic process are applied to said images.

17. The method as recited in claim 5, wherein structures are included when designing said photomask, said structures spanning a range of said mask critical dimension tolerance.

18. The method as recited in claim 17, wherein said structures are included in a section of said design that does not influence the functionality of said semiconductor device.

19. The method as recited in claim 17, wherein said structures are measured using an aerial image measurement system.

20. The method as recited in claim 17, wherein said structures are printed on said wafer by said lithographic process and are then further measured on said wafer.

21. The method as recited in claim 5, wherein films present on said wafer and settings of an exposure tool for said lithographic process are analyzed, said analysis resulting in a metric that defines the quality of said lithographic process and a value for said metric to achieve for said lithographic process to meet product specifications.

22. The method as recited in claim 21, wherein said product specifications include performance, size and cost.

23. The method as recited in claim 21, wherein said metric further quantifies said relationship between mask critical dimension error and said tolerable variation of said lithographic process, resulting in a first functional dependence of said metric on said mask critical dimension error.

24. The method as recited in claim 23, further comprising inverting said first functional dependence resulting in a second functional dependence of said mask critical dimension error on said metric.

25. The method as recited in claim 24, wherein said mask critical dimension tolerance is further determined by finding said mask critical dimension error at said value for said metric required to meet said product specifications.

26. The method as recited in claim 3, wherein said lithographic images are obtained by transferring a mask pattern from said photomask onto said wafer.

27. The method as recited in claim 3, wherein said lithographic images are aerial images, said aerial images being generated by an imaging system that emulates a lithographic exposure tool, said imaging system being referred to as an aerial image measurement system (AIMS).

28. The method as recited in claim 27, wherein said AIMS generates said aerial images by emulating optical components of said lithographic exposure tool.

29. The method as recited in claim 27, wherein said AIMS generates said aerial images by simulating photomask patterns based on measurements taken of said photomask patterns.

30. The method as recited in claim 27, wherein said AIMS is part of an inspection system.

31. The method as recited in claim 27, wherein design data for said photomask is provided to said AIMS.

32. The method as recited in claim 31, wherein said design data derives a relationship between variations in the size of a feature on said photomask and an amount of tolerable variation in said lithographic process.

33. The method as recited in claim 1, wherein said analysis further comprises analyzing the effect of process steps that follow said lithographic process, said process steps comprising photoresist development and etch.

34. A method for determining if a resolution enhancement feature that is desirable on a photomask will adversely affect the performance of a semiconductor device on a wafer, said device created by said photomask through a lithographic process, said resolution enhancement feature being included on said photomask to improve the ability of another critical feature on said photomask to be printed on said wafer, said method comprising the steps of:
  a) locating said resolution enhancement feature on said photomask;
  b) analyzing process conditions that result in said critical feature close to said resolution enhancement feature to be printed on said wafer with dimensions which fall within the wafer critical dimension tolerance that is applicable to said critical feature;
  c) assigning an equivalent critical dimension error to said resolution enhancement feature; and
  d) comparing said equivalent critical dimension error to a mask critical dimension error tolerance for determining whether said resolution enhancement feature adversely affects said semiconductor device.

35. The method as recited in claim 34, wherein said resolution enhancement feature alters a radiation transmission of said photomask, said resolution enhancement feature being characterized as an optical proximity correction (OPC) feature.

36. The method as recited in claim 35, wherein said OPC feature is a serif.

37. The method as recited in claim 35, wherein said OPC feature is a hammerhead.

38. The method as recited in claim 35, wherein said OPC feature is a scattering bar.

39. The method as recited in claim 35, wherein said OPC feature is an anti-scattering bar.

40. The method as recited in claim 35, wherein said OPC feature is added to the design of said semiconductor device by a computer program that adds OPC features to semiconductor designs to improve the ability of said lithographic process to transfer said design onto said wafer, said semiconductor design being modified by said computer program and said modified design being considered an OPC corrected design.

41. The method as recited in claim 35, wherein said semiconductor design is available at an inspection tool.

42. The method as recited in claim 35, wherein said OPC corrected design is available at an inspection tool.

43. The method as recited in claim 34, wherein said resolution enhancement feature alters the phase of radiation passing through said photomask, said resolution enhancement feature being considered a phase shifting feature.

44. The method as recited in claim 43, wherein said phase shifting feature is made by removing material from a substrate of said photomask.

45. The method as recited in claim 43, wherein said phase shifting feature is made by depositing a material on a substrate of said photomask, said material transmitting a portion of said radiation.

46. The method as recited in claim 45, wherein said portion of said radiation is approximately 100%.

47. The method as recited in claim 45, wherein said portion of said radiation is approximately 5–10%.

48. A method for determining if a feature that is desirable on a photomask will adversely affect the performance of a semiconductor device on a wafer, said device created by said photomask through a lithographic process, said method comprising the steps of:
  a) locating said desirable feature on said photomask;
  b) analyzing process conditions that result in said desirable feature to be printed on said wafer with dimensions that fall within the wafer critical dimension tolerance that is applicable to said feature;
  c) assigning an equivalent critical dimension error to said feature, wherein said equivalent critical dimension error compares the variation of said desirable feature to a critical dimension variation of another reference feature; and
  d) comparing said equivalent critical dimension error to a mask critical dimension error tolerance for determining whether said desirable feature adversely affects said semiconductor device.

49. The method as recited in claim 48, wherein locating said desirable feature is performed on an inspection tool capable of measuring dimensions of critical features.

50. The method as recited in claim 48, wherein locating said desirable feature is performed by finding coordinates of said desirable feature from design data of said photomask.

51. The method as recited in claim 48, wherein said equivalent critical dimension error is determined by analyzing an image of said photomask, said image being approximately equivalent to an image of said photomask that would be printed in photoresist using said lithographic process, and said mask critical dimension error tolerance being determined by analysis of said reference feature that differs from said desirable feature.

52. The method as recited in claim 51, wherein said reference feature has a nearest neighboring feature that is placed at a distance away from said reference feature that is different from the distance between said desirable feature and its nearest neighboring feature.

* * * * *